United States Patent
Hamaguchi et al.

(10) Patent No.: US 7,041,988 B2
(45) Date of Patent: May 9, 2006

(54) ELECTRON BEAM EXPOSURE APPARATUS AND ELECTRON BEAM PROCESSING APPARATUS

(75) Inventors: Shinichi Hamaguchi, Tokyo (JP); Susumu Goto, Tokyo (JP); Osamu Kamimura, Tokyo (JP); Yasunari Sohda, Tokyo (JP)

(73) Assignees: Advantest Corp., Tokyo (JP); Canon Kabushiki Kaisha, Tokyo (JP); Hitachi, Ltd, Tokyo (JP)

( * ) Notice: Subject to any disclaimer, the term of this patent is extended or adjusted under 35 U.S.C. 154(b) by 0 days.

(21) Appl. No.: 10/431,782

(22) Filed: May 8, 2003

(65) Prior Publication Data

US 2003/0209674 A1    Nov. 13, 2003

(30) Foreign Application Priority Data

May 10, 2002 (JP) .............................. 2002-135891
May 10, 2002 (JP) .............................. 2002-135892

(51) Int. Cl.
*G21G 5/00* (2006.01)
*G21K 5/10* (2006.01)

(52) U.S. Cl. ............................ 250/492.2; 250/492.1; 250/492.22; 250/492.23

(58) Field of Classification Search ............. 250/492.1, 250/492.22, 492.2
See application file for complete search history.

(56) References Cited

U.S. PATENT DOCUMENTS 6,630,681 B1 * 10/2003 Kojima .................. 250/492.22
6,703,630 B1 *  3/2004 Kurokawa ............. 250/492.22

FOREIGN PATENT DOCUMENTS

| JP | 09-245708 | 9/1997 |
| JP | 11-176737 | 7/1999 |
| JP | 2001-267221 | 9/2001 |

* cited by examiner

*Primary Examiner*—John R. Lee
*Assistant Examiner*—Paul M. Gurzo
(74) *Attorney, Agent, or Firm*—Muramatsu & Associates

(57) ABSTRACT

An electron beam exposure apparatus for exposing wafer with an electron beam, includes: a first electromagnetic lens system for making the electron beam incident substantially perpendicularly on a first plane be incident on a second plane substantially perpendicularly; a second electromagnetic lens system for making the electron beam that was substantially perpendicularly incident on the second plane be incident on the wafer substantially perpendicularly; a rotation correction lens provided within the first electromagnetic lens system for correcting rotation of the electron beam caused by at least the first electromagnetic lens system; a deflection system for deflecting the electron beam to a position on the wafer; and a deflection-correction optical system provided within the second electromagnetic lens system for correcting deflection aberration caused by the deflection system.

16 Claims, 6 Drawing Sheets

ELECTRON BEAM EXPOSURE APPARATUS AND ELECTRON BEAM PROCESSING APPARATUS

This patent application claims priority from Japanese patent applications Nos. 2002-135891 and 2002-135892 both filed on May 10, 2002, the contents of which are incorporated herein by reference.

BACKGROUND OF THE INVENTION

1. Field of the Invention

The present invention relates to an electron beam exposure apparatus and an electron beam processing apparatus. More particularly, the present invention relates to an electron beam exposure apparatus which can expose wafer with using an electron beam or a plurality of electron beams so that a pattern is transferred onto the wafer with high precision.

2. Description of the Related Art

With the size reduction of semiconductor devices in recent years, various electron beam exposure apparatuses have been developed in order to improve the resolution and throughput of the semiconductor devices. For example, Japanese Patent Application Laying-Open No. 11-176737 discloses an electron beam apparatus that corrects deflection aberration in an electron beam in accordance with a transferred position on wafer, height of the wafer, a beam current and a way in which patterns are scattered. Japanese Patent Application Laid-Open No. 9-245708 discloses an electron beam exposure apparatus that corrects in advance aberration occurring when the cross section of the electron beam is reduced. Moreover, Japanese Patent Application Laying-Open No. 2001-267221 discloses an electron beam exposure apparatus that corrects distortion aberration in a plurality of electron beams generated by splitting a single electron beam.

However, the electron beam exposure apparatus disclosed in Japanese Patent Application Laying-Open No. 11-176737 has a problem that a function for calculating correction data, that is to be supplied to respective deflectors, becomes complex since the correction data is calculated in accordance with the transferred position on the wafer, the height of the wafer, the beam current and the way in which the patterns are scattered to respective deflectors. In addition, the electron beam exposure apparatuses disclosed in Japanese Patent Application Laid-Open Nos. 9-245708 and 2001-267221 have a problem that it is difficult to correct rotation of an image of the electron beam that is caused when the cross section of the electron beam is reduced.

SUMMARY OF THE INVENTION

Therefore, it is an object of the present invention to provide an electron beam exposure apparatus and an electron beam processing apparatus, which are capable of overcoming the above drawbacks accompanying the conventional art. The above and other objects can be achieved by combinations described in the independent claims. The dependent claims define further advantageous and exemplary combinations of the present invention.

According to the first aspect of the present invention, an electron beam exposure apparatus for exposing wafer with an electron beam, comprises: a first electromagnetic lens system operable to make the electron beam that was incident substantially perpendicularly on a first plane be incident on a second plane substantially perpendicularly; a second electromagnetic lens system operable to make the electron beam that was substantially perpendicularly incident on the second plane be incident on the wafer substantially perpendicularly; a rotation correction lens operable to correct rotation of the electron beam caused by the first electromagnetic lens system and/or the second electromagnetic lens system; a deflection system operable to deflect the electron beam to a position on the wafer, that is to be irradiated with the electron beam; and a deflection-correction optical system operable to correct deflection aberration caused by the deflection system.

The first electromagnetic lens system may reduce the electron beam incident on the first plane and make the reduced electron beam be incident on the second plane. Also, the second electromagnetic lens system may reduce the electron beam incident on the second plane and make the reduced electron beam be incident on the wafer.

The rotation correction lens may be provided between the first plane and the second plane.

The deflection-correction optical system maybe provided between the second plane and the wafer.

The first electromagnetic lens system may include: a first electromagnetic lens having a first focal length; and a second electromagnetic lens having a second focal length, the second electromagnetic lens being arranged away from the first electromagnetic lens substantially by a distance obtained by adding the first focal length and the second focal length. Also, the second electromagnetic lens system may include: a third electromagnetic lens having a third focal length; and a fourth electromagnetic lens having a fourth focal length, the fourth electromagnetic lens being arranged away from the third electromagnetic lens substantially by a distance obtained by adding the third focal length and the fourth focal length.

The first electromagnetic lens may generate a magnetic field in a first direction. In this case, the second electromagnetic lens may generate a magnetic field in a second direction opposite to the first direction, the third electromagnetic lens generates a magnetic field in the second direction, and the fourth electromagnetic lens generates a magnetic field in the first direction.

The rotation correction lens may be arranged within a magnetic field generated by the first electromagnetic lens or the second electromagnetic lens.

A lens center of the rotation correction lens may be arranged at a position approximately equal to a lens center of the second electromagnetic lens in a direction in which the electron beam travels.

A lens axis of the rotation correction lens may be located at a position approximately equal to a lens axis of the second electromagnetic lens in a direction substantially perpendicular to the direction in which the electron beam travels.

The rotation correction lens may be an electrostatic lens.

The rotation correction lens may further correct magnification of the electron beam changed by the first electromagnetic lens system and/or the second electromagnetic lens system.

The deflection system may include a main deflector and a sub-deflector, wherein the deflection-correction optical system corrects the deflection aberration of the electron beam caused by at least one of the main deflector and the sub-deflector.

The deflection-correction optical system may include: an astigmatism corrector operable to correct astigmatism of the electron beam; and a focus corrector operable to correct a focus of the electron beam.

The electron beam exposure apparatus may further comprise: an electron gun operable to emit the electron beam; and an illumination electron optical system operable to make the electron beam emitted by the electron gun be incident on the first plane substantially perpendicularly.

The electron beam exposure apparatus further comprises a correction electron optical system operable to split the electron beam that was substantially perpendicularly incident on the first plane into a plurality of electron beams.

According to the second aspect of the present invention, an electron beam exposure apparatus for exposing wafer with an electron beam, comprises: a first electromagnetic lens system operable to make the electron beam that was substantially perpendicularly incident on a first plane be incident on a second plane substantially perpendicularly; a second electromagnetic lens system operable to make the electron beam that was substantially perpendicularly incident on the second plane be incident on the wafer substantially perpendicularly; a magnification correction lens operable to correct magnification of the electron beam changed by the first electromagnetic lens system and/or the second electromagnetic lens system; a deflection system operable to deflect the electron beam to a position on the wafer, that is to be irradiated with the electron beam; and a deflection-correction optical system operable to correct deflection aberration caused by the deflection system.

According to the third aspect of the present invention, an electron beam processing unit comprises: a first electromagnetic lens system operable to make an electron beam that was substantially perpendicularly incident on a first plane be incident on a second plane substantially perpendicularly; a second electromagnetic lens system operable to make the electron beam that was substantially perpendicularly incident on the second plane be incident on a third plane substantially perpendicularly; a rotation correction lens operable to correct rotation of the electron beam caused by the first electromagnetic lens system and/or the second electromagnetic lens system; a deflection system operable to deflect the electron beam to a position on the third plane, that is to be irradiated with the electron beam; and a deflection-correction optical system operable to correct deflection aberration caused by the deflection system.

According to the fourth aspect of the present invention, an electron beam processing unit comprises: a first electromagnetic lens system operable to make an electron beam that was substantially perpendicularly incident on a first plane be incident on a second plane substantially perpendicularly; a second electromagnetic lens system operable to make the electron beam that was substantially perpendicularly incident on the second plane be incident on a third plane substantially perpendicularly; a magnification correction lens operable to correct magnification of the electron beam changed by the first electromagnetic lens system and/or the second electromagnetic lens system; a deflection system operable to deflect the electron beam to a position on the third plane, that is to be irradiated with the electron beam; and a deflection-correction optical system operable to correct deflection aberration caused by the deflection system.

According to the fifth aspect of the present invention, an electron beam exposure apparatus for exposing wafer with a plurality of electron beams, comprises: a first electromagnetic lens system operable to make the electron beams that were substantially perpendicularly incident on a first plane be incident on a second plane substantially perpendicularly; a second electromagnetic lens system operable to make the electron beams that were substantially perpendicularly incident on the second plane be incident on the wafer substantially perpendicularly; and a plurality of first rotation correction lenses operable to correct rotations of the electron beams caused by the first electromagnetic lens system and/or the second electromagnetic lens system, respectively.

The first electromagnetic lens system may reduce the plurality of electron beams that were incident on the first plane, respectively, and may make the reduced electron beams be incident on the second plane. Also, the second electromagnetic lens system may reduce the plurality of electron beams that were incident on the second plane, respectively, and may make the reduced electron beams be incident on the wafer.

Each of the first rotation correction lenses may correct rotation of a corresponding one of the electron beams that passes therethrough, based on a position on the wafer on which the corresponding electron beam is incident.

Each of the first rotation correction lenses may correct rotation of a corresponding one of the electron beams that passes therethrough, based on a position on the first plane at which the corresponding electron beam passes through the first plane.

The first rotation correction lenses may be provided between the first plane and the second plane.

The electron beam exposure apparatus may further comprise a plurality of first magnification correction lenses operable to correct magnifications of the electron beams, respectively.

Each of the first magnification correction lenses may correct magnification of a corresponding one of the electron beams, based on a position on the wafer on which the corresponding electron beam is incident.

Each of the first magnification correction lenses may correct magnification of a corresponding one of the electron beams, based on a position on the first plane at which the corresponding electron beam passes through the first plane.

Each of the first magnification correction lenses may correct magnification of a corresponding one of the electron beams that passes therethrough, the magnification being changed by one of the rotation correction lenses, through which the corresponding electron beam passes.

The first magnification correction lenses may correct the magnifications of the electron beams changed by the first electromagnetic lens system and/or the second electromagnetic lens system.

The first magnification correction lenses may be provided between the first plane and the second plane.

The first electromagnetic lens system may include: a first multi-axis electromagnetic lens, having a plurality of first lens openings through which the electron beams pass, respectively, operable to converge the electron beams independently of each other; and a second multi-axis electromagnetic lens, having a plurality of second lens openings through which the electron beams pass, respectively, operable to converge the electron beams independently of each other. Also, the second electromagnetic lens system may include: a third multi-axis electromagnetic lens, having a plurality of third lens openings through which the electron beams pass, respectively, operable to converge the electron beams independently of each other; and a fourth multi-axis electromagnetic lens, having a plurality of fourth lens openings through which the electron beams pass, respectively, operable to converge the electron beams independently of each other.

The first multi-axis electromagnetic lens may have a first focal length; the second multi-axis electromagnetic lens may have a second focal length and be arranged away from the first multi-axis electromagnetic lens substantially by a distance obtained by adding the first focal length and the second focal length; the third multi-axis electromagnetic lens may have a third focal length; and the fourth multi-axis electromagnetic lens may have a fourth focal length and be arranged away from the third multi-axis electromagnetic lens substantially by a distance obtained by adding the third focal length and the fourth focal length.

The first multi-axis electromagnetic lens may generate a magnetic field in a first direction; the second multi-axis electromagnetic lens may generate a magnetic field in a second direction opposite to the first direction; the third multi-axis electromagnetic lens may generate a magnetic field in the second direction; and the fourth multi-axis electromagnetic lens may generate a magnetic field in the first direction.

The first rotation correction lenses may be provided within magnetic fields generated by the second lens openings of the second multi-axis electromagnetic lens.

The rotation correction lenses may correct the rotations of the electron beams based on intensities of the magnetic fields generated by the second lens openings, respectively.

The first rotation correction lenses may be arranged at positions that are approximately equal to a position of the second multi-axis electromagnetic lens in a direction in which the electron beams travel.

The electron beam exposure apparatus may further comprise first magnification correction lenses, provided in such a manner that each of centers of the first magnification correction lenses is located approximately on a lens axis of a corresponding one of the rotation correction lenses, operable to correct magnifications of the electron beams changed by the first rotation correction lenses, respectively.

The first magnification correction lenses may be provided in such a manner that the centers are located approximately on focus positions of the second multi-axis electromagnetic lens.

The electron beam exposure apparatus may further comprise second rotation correction lenses, provided in such a manner that centers thereof are located approximately on lens axes of the first rotation correction lenses, operable to correct the rotations of the electron beams caused by the first electromagnetic lens system and/or the second electromagnetic lens system.

The second rotation correction lenses may be provided within magnetic fields generated by the first lens openings of the first multi-axis electromagnetic lens.

The second rotation correction lenses may correct the rotations of the electron beams based on intensities of the magnetic fields of the first lens openings.

The second rotation correction lenses may be provided at positions that are approximately equal to a position of the first multi-axis electromagnetic lens in a direction in which the electron beams travel.

The electron beam exposure apparatus may further comprise a plurality of second magnification correction lenses, provided in such a manner that centers thereof are located approximately on lens axes of the second rotation correction lenses, operable to correct magnifications of the electron beams changed by the second rotation correction lenses, respectively.

The second magnification correction lenses may be provided within magnetic fields generated by the first lens openings of the first multi-axis electromagnetic lens.

The electron beam exposure apparatus may further comprise a plurality of third magnification correction lenses, provided in such a manner that centers thereof are located approximately on the lens axes of the second rotation correction lenses, operable to correct the magnifications of the electron beams changed by the second rotation correction lenses.

The second magnification correction lenses and the third magnification correction lenses may be arranged in such a manner that each of the second magnification correction lenses is opposed to a corresponding one of the third magnification correction lenses with a corresponding one of the second rotation correction lenses sandwiched therebetween.

The first rotation correction lenses may be provided within magnetic fields generated by the second lens openings of the second multi-axis electromagnetic lens.

The electron beam exposure apparatus may further comprise a deflection system, provided between the second plane and the wafer, operable to deflect the electron beams to positions on the wafer, that are to be irradiated with the electron beams.

The electron beam exposure apparatus may further comprise: a plurality of electron guns operable to emit the plurality of electron beams, respectively; and an illumination electron optical system operable to make the plurality of electron beams respectively emitted by the plurality of electron guns be incident on the first plane substantially perpendicularly.

The electron beam exposure apparatus may further comprise a correction electron optical system operable to split each of the plurality of electron beams that were substantially perpendicularly incident on the first plane into a plurality of split beams.

According to the sixth aspect of the present invention, an electron beam exposure apparatus for exposing wafer with a plurality of electron beams, comprises: a first electromagnetic lens system operable to make the electron beams that were substantially perpendicularly incident on a first plane be incident on a second plane substantially perpendicularly; a second electromagnetic lens system operable to make the electron beams that were substantially perpendicularly incident on the second plane be incident on the wafer substantially perpendicularly; and a plurality of first magnification correction lenses operable to correct magnifications of the electron beams changed by the first electromagnetic lens system and/or the second electromagnetic lens system.

According to the seventh aspect of the present invention, an electron beam processing apparatus comprises: a first electromagnetic lens system operable to make a plurality of electron beams that were substantially perpendicularly incident on a first plane be incident on a second plane substantially perpendicularly; a second electromagnetic lens system operable to make the electron beams that were substantially perpendicularly incident on the second plane be incident on a third plane substantially perpendicularly; and a plurality of first rotation correction lenses operable to correct rotations of the electron beams caused by the first electromagnetic lens system and/or the second electromagnetic lens system.

According to the eighth aspect of the present invention, an electron beam processing apparatus comprises: a first electromagnetic lens system operable to make a plurality of electron beams that were substantially perpendicularly incident on a first plane be incident on a second plane substantially perpendicularly; a second electromagnetic lens system operable to make the electron beams that were substantially perpendicularly incident on the second plane be incident on a third plane substantially perpendicularly; and a plurality of first magnification correction lenses operable to correct magnifications of the electron beams changed by the first electromagnetic lens system and/or the second electromagnetic lens system.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

(Embodiment 1)

Figure 1:
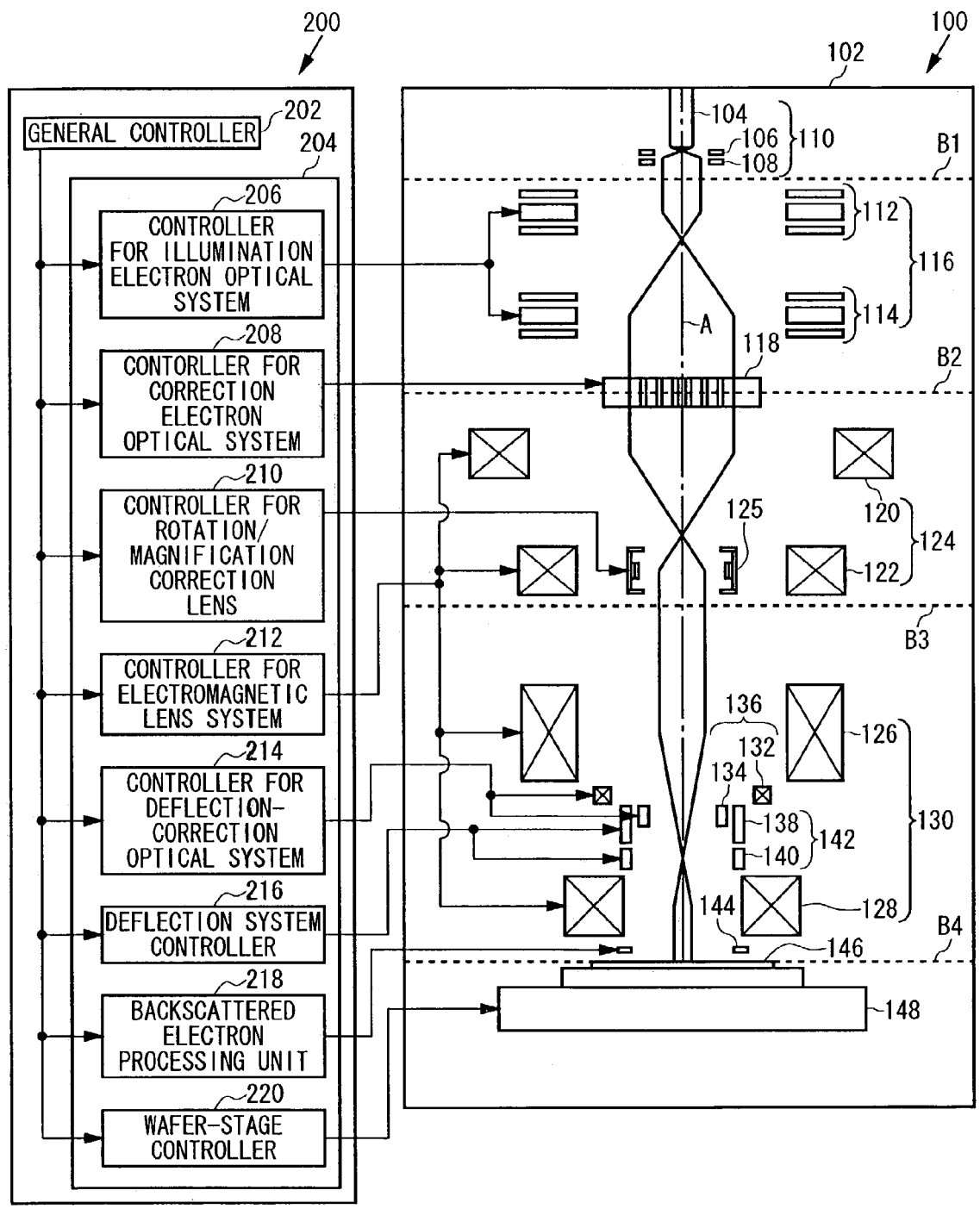
FIG. 1 shows an exemplary structure of an electron beam exposure apparatus according to the first embodiment of the present invention.

FIG. 1 illustrates an exemplary structure of an electron beam exposure apparatus 10 according to the first embodiment of the present invention. The electron beam exposure apparatus 10 includes an exposure unit 100 for performing a predetermined exposure process for wafer 146 and a controlling system 200 for controlling operations of respective units in the exposure unit 100. Please note that a dot-dashed line represents an optical axis A of an electron beam and a dotted line represents focal planes B1, B2, B3 and B4 of the electron beam.

The exposure unit 100 includes, within a body 102, an electron gun 110 that generates an electron beam to make it be incident on the focal plane B1; an illumination electron optical system 116 that enlarges the cross section of the electron beam incident on the focal plane B1 and makes the electron beam having the enlarged cross section be incident on the focal plane B2; a correction electron optical system 118 that splits the electron beam into a plurality of electron beams; the first electromagnetic lens system 124 that reduces the cross section of the electron beam incident from the focal plane B2 and makes the electron beam having the reduced cross section be incident on the focal plane B3; a rotation/magnification correction lens 125 that corrects the rotation and/or magnification of the electron beam by being combined with the first electromagnetic lens system 124; the second electromagnetic lens system 130 that reduces the cross section of the electron beam incident from the focal plane B3 and makes the electron beam having the reduced cross section be incident on the focal plane B4 (i.e., the surface of the wafer 146); a deflection-correction optical system 136 that corrects deflection aberration in the electron beam; a deflection system 142 that deflects the electron beam to a position on the wafer 146 which is to be irradiated with the electron beam; a backscattered electron detector 144 that detects backscattered electrons of the electron beam incident on a mark on the focal plane B4 (i.e., the surface of the wafer 146); and a wafer stage 148 onto which the wafer 146 is placed.

The electron gun 110 includes a cathode 104, a grid 106 and an anode 108. The electron beam emitted from the cathode 104 generates a crossover image between the grid 106 and the anode 108. The size of the crossover image can be changed by changing a voltage applied to the grid 106.

The illumination electron optical system 116 includes electrostatic lenses 112 and 114 each having three aperture-electrodes. The electrostatic lenses 112 and 114 enlarge the cross section of the electron beam generated by the electron gun 110 and then make it be incident on the focal plane B2 substantially perpendicularly to the focal plane B2. In other words, the electrostatic lenses 112 and 114 make the electron beam enter a desired region in the correction electron optical system 118 substantially perpendicularly.

The correction electron optical system 118 includes an aperture array, a blanker array, an electromagnetic lens array and a stopper array that will be described later, and splits the electron beam that was substantially perpendicularly incident on the focal plane B2 into a plurality of electron beams and further adjusts focus positions of the respective electron beams. The correction electron optical system 118 will be described later, referring to FIG. 2.

The first electromagnetic lens system 124 has the first electromagnetic lens 120 and the second electromagnetic lens 122. The first electromagnetic lens system 124 is a doublet in which the first and second electromagnetic lenses 120 and 122 are arranged side by side in the direction of the optical axis A. In a case where the first electromagnetic lens 120 has a focal length of f1 and the second electromagnetic lens 122 has a focal length of f2, the first and second electromagnetic lenses 120 and 122 are arranged away from each other by a distance obtained by adding f1 and f2. The object point of the first electromagnetic lens system 124 is located at the focus position of the first electromagnetic lens 120 (i.e., on the focal plane B2), while the image point of the first electromagnetic lens system 124 is located at the focus position of the second electromagnetic lens 122 (i.e., o the focal plane B3). The first electromagnetic lens system 124 reduces the cross section of the electron beam to f2/f1 times.

It is desirable that the first and second electromagnetic lenses 120 and 122 generate magnetic fields that act in opposite directions to each other. Each of the first and second electromagnetic lenses 120 and 122 has a coil wound in such a manner that the substantial coil center is positioned on the optical axis A, and generates the magnetic field substantially parallel to the optical axis A. In a case where the first electromagnetic lens 120 generates the magnetic field in the first direction substantially parallel to the optical axis A, it is desirable that the second electromagnetic lens 122 generate the magnetic field in the second direction substantially opposite to the first direction. Since the first and second electromagnetic lenses 120 and 122 generate the magnetic fields that act in the opposite directions to each other, the aberration caused in the electron beam by the optical system can be reduced. Especially, chromatic aberration related to magnification, rotation and the like can be reduced.

The rotation/magnification correction lens 125 is an electrostatic lens that can correct the rotation of the electron beam with respect to the optical axis A and/or the magnification (i.e., the reduction ratio) of the electron beam by the first and second electromagnetic lenses 120 and 122 included in the first electromagnetic lens system 124 and the third and fourth electromagnetic lenses 126 and 128 included in the second electromagnetic lens system 130, by being combined with the first and second electromagnetic lenses 120 and 122. More specifically, the rotation/magnification correction lens 125 corrects the rotation amount and/or the size of the image of the electron beam on the wafer 146. It is preferable that the rotation/magnification correction lens 125 be a uni-potential lens. It is also preferable that the rotation/magnification correction lens 125 be provided between the focal planes B2 and B3 within the magnetic field generated by the first or second electromagnetic lens 120 or 122. It is also preferable that the rotation/magnification correction lens 125 be arranged to have a lens center at a position substantially equal to a lens center of the second electromagnetic lens 122 in the direction in which the electron beam travels. That is, the rotation/magnification correction lens 125 and the second electromagnetic lens 122 are preferably arranged on the same plane that is substantially perpendicular to the optical axis A. Moreover, it is preferable that the lens axis of the rotation/magnification correction lens 125 be arranged at a position substantially equal to the lens axis of the second electromagnetic lens 122 in a direction substantially perpendicular to the direction in which the electron beam travels. That is, the rotation/magnification correction lens 125 and the second electromagnetic lens 122 are preferably arranged to locate their centers on the optical axis A. In other words, the rotation/magnification correction lens 125 is preferably arranged in the lens center of the second electromagnetic lens 122. By arranging the rotation/magnification correction lens 125 in the lens center of the second electromagnetic lens 122, the rotation and/or the magnification of the electron beam on the wafer 146 can be efficiently corrected.

The second electromagnetic lens system 130 has the third and fourth electromagnetic lenses 126 and 128. The second electromagnetic lens system 130 is a doublet in which the third and fourth electromagnetic lenses 126 and 128 are arranged side by side along the direction of the optical axis A. In a case where the third electromagnetic lens 126 has a focal length of f3 and the fourth electromagnetic lens 128 has a focal length of f4, the third and fourth electromagnetic lenses 126 and 128 are arranged to be away from each other by a distance obtained by adding f3 and f4. The object point of the second electromagnetic lens system 130 is located at the focus position of the third electromagnetic lens 126 (i.e., on the focal plane B3), while the image point of the second electromagnetic lens system 130 is located at the focus position of the fourth electromagnetic lens 128 (i.e., on the focal plane B4). The second electromagnetic lens system 130 reduces the cross section of the electron beam to f4/f3 times.

It is desirable that the third and fourth electromagnetic lenses 126 and 128 generate magnetic fields that act in opposite directions to each other. Each of the third and fourth electromagnetic lenses 126 and 128 has a coil wound in such a manner that the coil center is positioned substantially on the optical axis A, and therefore generates the magnetic field substantially parallel to the optical axis A. In a case where the first electromagnetic lens 120 of the first electromagnetic lens system generates the magnetic field in the first direction, it is desirable that the third electromagnetic lens 126 generate the magnetic field in the second direction. Moreover, in this case, it is desirable that the fourth electromagnetic lens 128 generate the magnetic field in the first direction. Since the third and fourth electromagnetic lenses 126 and 128 generate the magnetic fields acting in the opposite directions to each other, the aberration caused in the electron beam by the optical system can be reduced. Especially, the chromatic aberration related to the magnification, the rotation and the like can be reduced.

The deflection system 142 has a main deflector 138 and a sub-deflector 140. The main deflector 138 is used for deflecting the electron beam from one of sub-fields to another, each sub-field containing a plurality of areas each of which can be irradiated with a single shot of the electron beam (i.e., shot areas). On the other hand, the sub-deflector 140 has a smaller deflection amount than the main deflector 138 and is used for deflecting the electron beam from one of the shot areas to another in each sub-field. The main deflector 138 is preferably formed by an electromagnetic deflector, while the sub-deflector 140 is preferably formed by an electrostatic deflector.

The deflection-correction optical system 136 has an astigmatism correction lens 132 and a focus correction lens 134. The deflection-correction optical system 136 corrects deflection aberration occurring when the deflection system 142 works, that is, deflection aberration based on the deflection amount and direction of the electron beam imaged on the wafer 146. The astigmatism correction lens 132 corrects astigmatism occurring when the main deflector 138 and/or the sub-deflector 140 works. The focus correction lens 134 corrects the displacement of the focus position caused when the main deflector 138 and/or the sub-deflector 140 works. Moreover, it is preferable that the deflection-correction optical system 136 be arranged between the focal plane B3 and the focal plane B4, i.e., the surface of the wafer 146.

By arranging the rotation/magnification correction lens 125 within the first electromagnetic lens system 124 and arranging the deflection-correction optical system 136 within the second electromagnetic lens system 130, it is possible to prevent the rotation/magnification correction lens 125 from mechanically overlapping the deflection-correction optical system 136. Moreover, it is possible to prevent optical interference between the rotation/magnification correction lens 125 and the deflection-correction optical system 136.

Please note that the focal plane B2 is positioned between the electron gun 110 and the wafer 145 while the focal plane B3 is positioned between the focal plane B2 and the wafer 146. Moreover, the focal planes B1, B2, B3 and B4 are substantially perpendicular to the optical axis A.

The controlling system 200 includes a general controller 202 and an individual controller 204. The general controller 202 is a workstation, for example, and generally controls respective controllers included in the individual controller 204. The individual controller 204 includes a controller for illumination electron optical system 206, a controller for correction electron optical system 208, a controller for rotation/magnification correction lens 210, a controller for electromagnetic lens system 212, a controller for deflection-correction optical system 213, a deflection system controller 216, a backscattered electron processing unit 218 and an wafer-stage controller 220.

The controller for illumination electron optical system 206 controls voltages respectively applied to the electrostatic lenses 112 and 114 of the illumination electron optical system 116. More specifically, the controller 206 adjusts the voltages respectively applied to the electrostatic lenses 112 and 114 independently of each other, thereby enlarging the cross section of the image of the electron beam formed on the focal plane B2, and further makes the electron beam having the enlarged cross section enter the correction electron optical system 118 substantially perpendicularly.

The controller for correction electron optical system 208 controls the correction electron optical system 118 including the aperture array, the blanker array, the electromagnetic lens array, and the stopper array. More specifically, the controller 208 controls voltages respectively applied to a plurality of blanking electrodes of the blanker array. In addition, the controller 208 controls powers respectively supplied to a plurality of electromagnetic lenses of the electromagnetic lens array.

The controller for rotation/magnification correction lens 210 controls a voltage applied to the rotation/magnification correction lens 125. More specifically, the controller 210 adjusts the voltage applied to the rotation/magnification correction lens 125 so as to allow the electron beam having the cross section of desired orientation and size to be incident o the wafer 146.

The controller for electromagnetic lens system 212 controls powers supplied to the first, second, third and fourth electromagnetic lenses 120, 122, 126 and 128. More specifically, the controller 212 adjusts the current amounts supplied to the coils of the first and second electromagnetic lenses 120 and 122 so that the first and second electromagnetic lenses 120 and 122 form together a doublet. Similarly, the controller 212 adjusts the current amounts supplied to the coils of the third and fourth electromagnetic lenses 126 and 128 so that the third and fourth electromagnetic lenses 126 and 128 form together a doublet.

In a case where the controller for rotation/magnification correction lens 210 corrects the rotation of the electron beam, the controller for electromagnetic lens system 212 adjusts the current amount supplied to the coil of the second electromagnetic lens 122 in order to correct the deviation of magnification of the electron beam caused by the correction of rotation made by the controller 210. In another case where the controller for rotation/magnification correction lens 210 corrects the magnification of the electron beam, the controller for electromagnetic lens system 212 adjusts the current amount supplied to the coil of the second electromagnetic lens 122 in order to correct the deviation of the rotation of the electron beam caused by the correction of magnification made by the controller 210.

The controller for deflection system 216 controls the deflection amounts of the electron beam by the main deflector 138 and the sub-deflector 140. The controller for deflection-correction optical system 214 adjusts powers respectively supplied to the astigmatism correction lens 132 and the focus correction lens 134 based on the amount and direction of the deflection of the electron beam by the main deflector 138 and/or the sub-deflector 140. More specifically, the controller 214 adjusts the powers respectively supplied to the astigmatism correction lens 132 and the focus correction lens 134 in synchronization with signals or a signal by which the deflection system controller 216 controls the main deflector 138 and/or the sub-deflector 140.

The backscattered electron processing unit 218 detects digital data indicative of the amount of electrons based on an electric signal detected by the backscattered electron detector 144, and sends the digital data to the general controller 202. The wafer-stage controller 220 moves the wafer stage 148 to a desired position.

Figure 2:
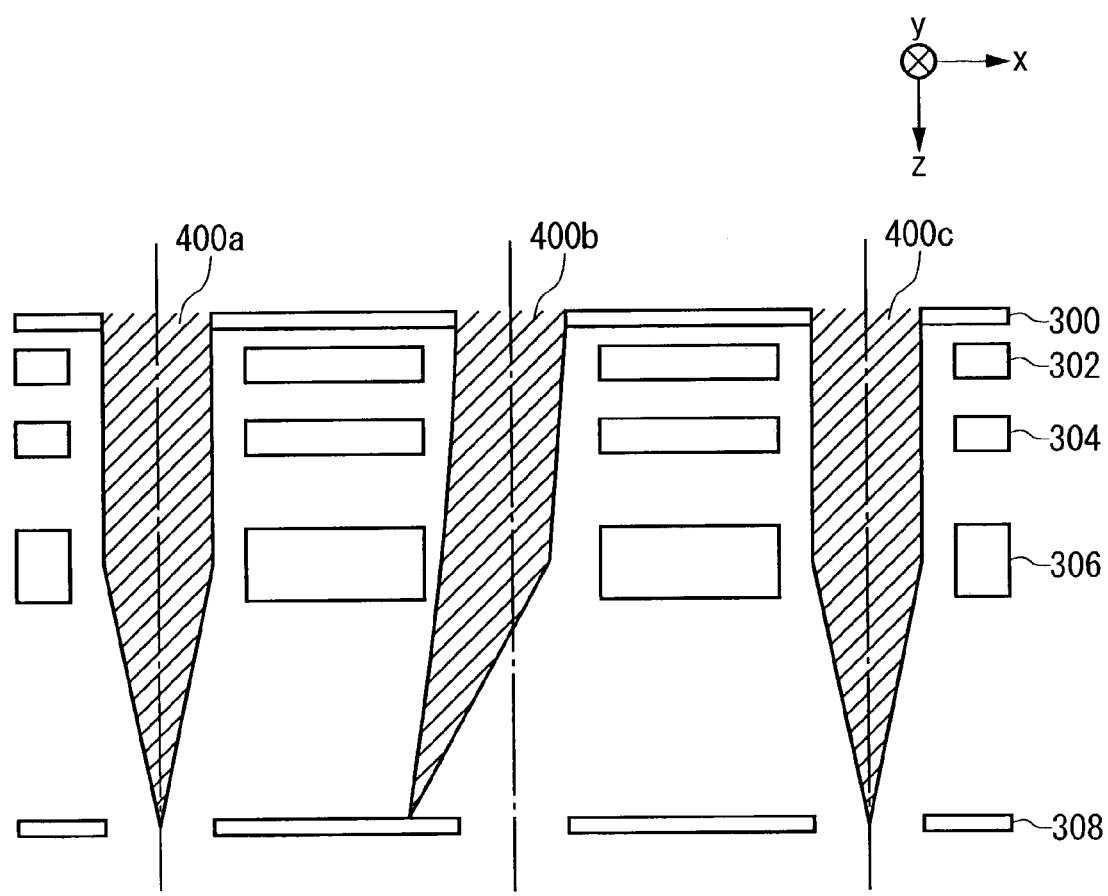
FIG. 2 shows an exemplary structure of a correction electron optical system provided in the electron beam exposure apparatus according to the first embodiment of the present invention.

FIG. 2 shows an exemplary structure of the correction electron optical system 118 according to the present embodiment. The correction electron optical system 118 includes an aperture array 300, an X-direction blanker array 302, a Y-direction blanker array 304, an electromagnetic lens array 306 and a stopper array 308.

The aperture array 300 has a plurality of apertures formed in a substrate each of which defines the cross-sectional shape of an electron beam, thereby splitting the electron beam that was substantially perpendicularly incident on the correction electron optical system 118 into a plurality of electron beams 400a, 400b 400c. The X-direction blanker array 302 has a plurality of individual deflectors that respectively deflect the corresponding electron beams obtained by the aperture array 300 in the X-direction. The Y-direction blanker array 304 has a plurality of minute deflectors that respectively deflect the corresponding electron beams obtained by the aperture array 300 in the Y-direction.

The electromagnetic lens array 306 has a plurality of electrostatic lenses that respectively converge the corresponding electron beams passing through the X-direction blanker array 302 and the Y-direction blanker array 304. The electromagnetic lens array 306 corrects distortion aberration caused by the first electromagnetic lens system 124 and/or the second electromagnetic lens system 130 by converging a plurality of electron beams independently of each other and adjusting the focus positions of the respective electron beams. The stopper array 308 has a plurality of apertures formed in a substrate, and blocks the electron beams deflected by the X-direction blanker array 302 and/or the Y-direction blanker array 304. The electron beam that was deflected by the X-direction blanker array 302 in the X-direction, like the electron beam 400b in FIG. 2, is not allowed to pass through the stopper array 308, so that it is blocked not to be incident on the wafer 146. On the other hand, the electron beam that was not deflected by the X-direction blanker array 302 and the Y-direction blanker array 304, like the electron beams 400a and 400c, passes through the stopper array 308 so as to reach the wafer 146.

Next, an operation of the electron beam exposure apparatus 10 according to the present embodiment is described referring to FIGS. 1 and 2. On the wafer stage 148, wafer 146 to be exposed is placed. The wafer-stage controller 220 moves the wafer stage 148 so as to place an area on the wafer 146 that is to be exposed in the vicinity of the optical axis A. Moreover, the X-direction blanker array 302 and/or the Y-direction blanker array 304 deflects the electron beam so as to prevent the electron beam from reaching the wafer 146 before a start of exposure since the electron gun 110 always emits the electron beam during the exposure process.

The controller for illumination electron optical system 206 adjusts the electrostatic lenses 112 and 114 in such a manner that the electron beam is incident on a desired region of the correction electron optical system 118 substantially perpendicularly. The controller for correction electron optical system 208 adjusts a plurality of electrostatic lenses of the electromagnetic lens array 306 included in the correction electron optical system 118 in order to allow each of a plurality of electron beams obtained by splitting the single electron beam to have desired imaging conditions. The controller for rotation/magnification correction lens 210 adjusts the rotation/magnification correction lens 125 to allow each of the electron beams to have a cross section of desired orientation and size on the wafer 146. The controller for electromagnetic lens system 212 adjusts the first, second, third and fourth electromagnetic lenses 120, 122, 126 and 128 so as to allow each of the electron beams to have the cross section of desired orientation and size on the wafer 146. The controller for rotation/magnification lens system 210 and the controller for electron lens system 212 are adjusted considering influences that the first, second, third and fourth electromagnetic lenses 120, 122, 126 and 128, and the rotation/magnification correction lens 125 have mutuality. The controller for deflection system 216 adjusts the main deflector 138 and the sub-deflector 140 to allow a plurality of electron beams to be incident on desired areas on the wafer 146. The controller for deflection-correction optical system 214 adjusts the astigmatism correction lens 132 and the focus correction lens 134 so as to correct the deflection aberration in the electron beam caused by the main deflector 138 and/or the sub-deflector 140.

After the illumination electron optical system 116, the correction electron optical system 118, the first electromagnetic lens system 124, the rotation/magnification correction lens 125, the second electromagnetic lens system 130, the deflection-correction optical system 136 and the deflection system 142 were adjusted, the deflection of the electron beam by the X-direction blanker array 302 and/or the Y-direction blanker array 304 of the correction electron optical system 118 is stopped. Thus, the electron beam starts to be incident on the wafer 146 as described below.

First, the illumination electron optical system 116 enlarges the cross section of the electron beam generated by the electron gun 110 and adjusts the focus position of the electron beam onto the correction electron optical system 118, and makes the electron beam substantially perpendicularly enter a predetermined region of the correction electron optical system 118. In the correction electron optical system 118, the aperture array 300 shapes the cross-sectional shape of the electron beam to be rectangular. The X-direction blanker array 302 and/or the Y-direction blanker array 304 switches its state between a state where the electron beam is allowed to be incident on the wafer 146 and a state where the electron beam is prevented from reaching the wafer 146 by applying the voltage to the respective blanking electrodes. The electron beam that was not deflected by the X-direction blanker array 302 and/or the Y-direction blanker array 304 is subjected to focus adjustment in the electromagnetic lens array 306 and then passes through the corresponding aperture of the stopper array 308. The electron beam that was deflected by the X-direction blanker array 302 and/or the Y-direction array 304 is also subjected to the focus adjustment in the electromagnetic lens array 306, but cannot pass through the corresponding aperture of the stopper array 308. That is, it is blocked by the stopper array 308.

Then, the first electromagnetic lens system 124 reduces the cross section of the electron beam that passed through the correction electron optical system 118. The rotation/magnification correction lens 125 then corrects the rotation of the electron beam with respect to the optical axis A and/or the magnification (i.e., the reduction ratio) of the electron beam, that occurs when the first and second electromagnetic lens systems 124 and 130 rotate the electron beam and reduce the cross section of the electron beam, by being combined with the first electromagnetic lens system 124.

Then, the second electromagnetic lens system 130 further reduces the cross section of the electron beam that was reduced by the first electromagnetic lens system 124 and adjusts the focus of the electron beam so that the focus be positioned on the wafer 146. The deflection system 142 deflects the electron beam by the main deflector 138 and the sub-deflector 140 to direct the electron beam onto a predetermined shot area on the wafer 146. The deflection-correction optical system 136 corrects by means of the astigmatism correction lens 132 astigmatism occurring when the main deflector 138 and/or the sub-deflector 140 works and also corrects by means of the focus correction lens 134 the displacement of the focus position when the main deflector 138 and/or the sub-deflector 140 works. Then, the electron beam is incident on the wafer 146, thereby transferring a pattern image of the apertures of the aperture array 300 onto the predetermined shot area on the wafer 146. By the aforementioned process, a pattern having the shape of the apertures of the aperture array 300 is transferred on the predetermined shot area on the wafer 146 by exposure.

According to the electron beam exposure apparatus 10 according to the present embodiment, the rotation/magnification correction lens 125 and the first electromagnetic lens system 124 that correct in combination the amount of a static error such as the rotation and magnification of the electron beam caused by the first and second electromagnetic lens systems 124 and 130, and the like, are provided separately from the deflection-correction optical system 136 for correcting the amount of a dynamic error occurring when the deflection system 142 works. Therefore, it is possible to precisely correct the rotation and magnification of the electron beam, aberration in the electron beam and the like. Moreover, the rotation/magnification correction lens 125 and the first electromagnetic lens system 124 operate based on correction coefficients for correcting the static error amount, whereas the deflection-correction optical system 136 operates based on correction coefficients for correcting the dynamic error amount. Therefore, interference between the correction coefficients can be reduced.

Please note that the electron beam exposure apparatus according to the present invention may be an electron beam exposure apparatus using a variable rectangle or an electron beam exposure apparatus using a blanking aperture array device. The electron beam exposure apparatus 10 mentioned above is an exemplary electron beam processing apparatus of the present invention. The electron beam processing apparatus according to the present invention may be an electron microscope, an electron beam tester or the like, other than the electron beam exposure apparatus.

As is apparent from the above description, according to the present invention, an electron beam exposure apparatus that transfers a pattern onto wafer by exposure using an electron beam can be provided.

(Embodiment 2)

Figure 3:
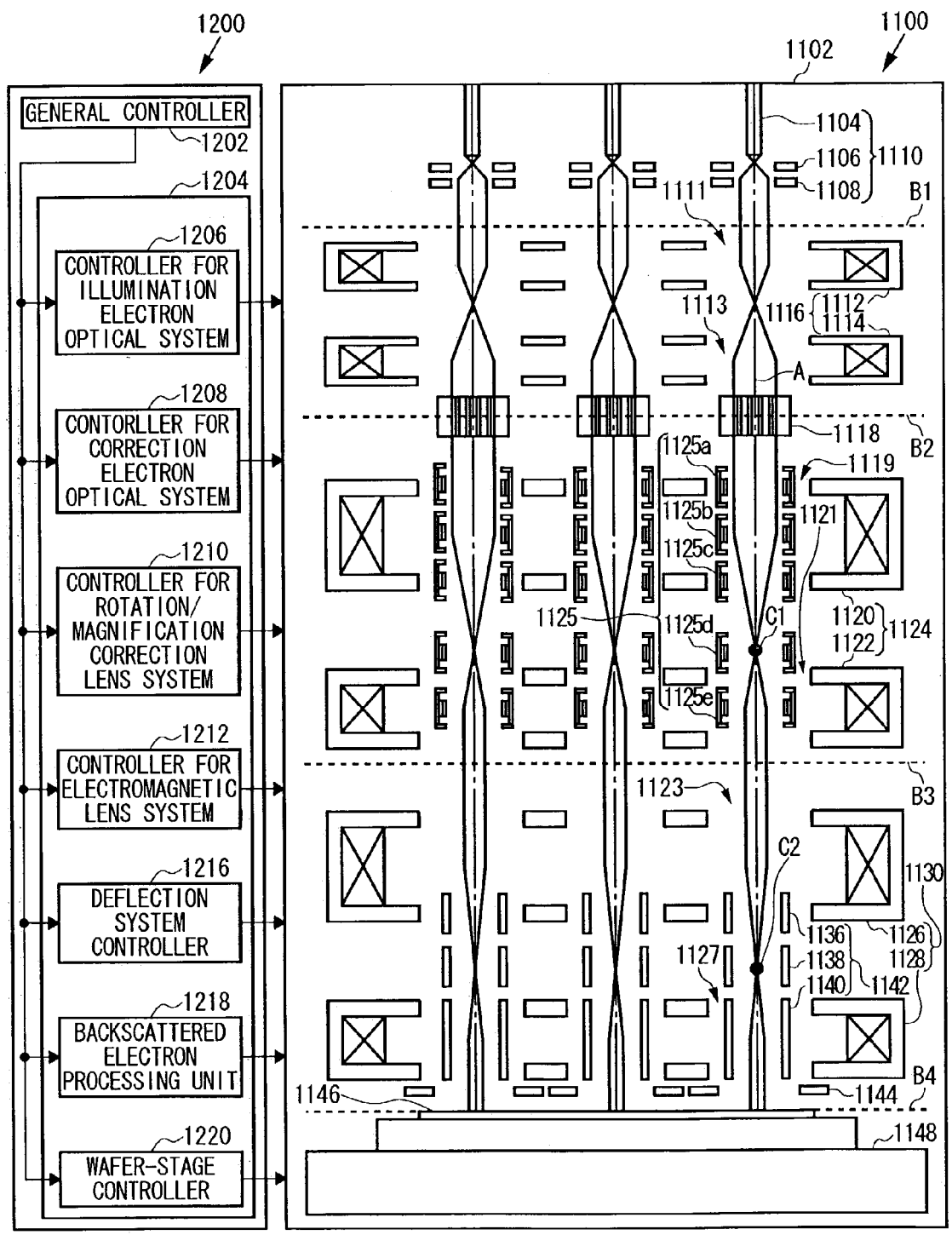
FIG. 3 shows an exemplary structure of an electron beam exposure apparatus according to the second embodiment of the present invention.

FIG. 3 illustrates an exemplary structure of an electron beam exposure apparatus 1010 according to the second embodiment of the present invention. The electron beam exposure apparatus 1010 includes an exposure unit 1100 for performing a predetermined exposure process for wafer 1146 and a controlling system 1200 for controlling operations of respective units in the exposure unit 1100. Please note that a dot-dashed line represents an optical axis A of an electron beam and a dotted line represents focal planes B1, B2, B3 and B4 of the electron beam.

The exposure unit 1100 includes, within a body 1102, a plurality of electron guns 1110 that respectively generate a plurality of electron beams and make them be incident on the focal plane B1; an illumination electron optical system 1116 that enlarges the cross section of each of the electron beams incident on the focal plane B1 and converges the electron beams to make it be incident on the focal plane B2; a plurality of correction electron optical systems 1118 each of which splits the corresponding one of the electron beams into a plurality of split beams so as to generate an electron beam containing the split beams; the first electromagnetic lens system 1124 which reduces the cross sections of the electron beams entering from the focal plane B2 and converges the electron beams to make them be incident on the focal plane B3; a plurality of rotation/magnification correction lens systems 1125 each correcting the rotation and/or magnification of the corresponding electron beam; the second electromagnetic lens system 1130 that reduces the cross section of each of the electron beams entering from the focal plane B3 and converges the electron beams to make them be incident on the focal plane B4 (i.e., the surface of the wafer 1146); a plurality of deflection systems 1142 each of which deflects the corresponding electron beam to a position on the wafer 1146, which is to be irradiated with that electron beam; a backscattered electron detector 1144 that detects backscattered electrons of the electron beam incident on a mark on the focal plane B4 (i.e., the surface of the wafer 1146); and a wafer stage 1148 onto which the wafer 1146 is placed.

The electron gun 1110 includes a cathode 1104, a grid 1106 and an anode 1108. The electron beam emitted from the cathode 1104 generates a crossover image between the grid 1106 and the anode 1108. The size of the crossover image is changed by changing a voltage applied to the grid 1106.

The illumination electron optical system 1116 includes the first and second multi-axis electromagnetic lenses 1112 and 1114. The first multi-axis electromagnetic lens 1112 has a plurality of lens openings 1111 through which a plurality of electron beams pass, respectively. The second multi-axis electromagnetic lens 1114 also has a plurality of lens openings 1113 through which a plurality of electron beams pass, respectively. The illumination electron optical system 1116 enlarges cross sections of a plurality of electron beams respectively generated by a plurality of electron guns 1110 and makes them be perpendicularly incident on the focal plane B2 by means of the first and second multi-axis electromagnetic lenses 1112 and 1114. In other words, the illumination electron optical system 1116 makes the electron beams be incident on desired regions in the correction electron optical systems 1118 corresponding to the electron beams substantially perpendicularly, respectively.

Each correction electron optical system 1118 includes an aperture array, a blanker array, an electromagnetic lens array and a stopper array that will be described later, and splits the corresponding electron beam that was substantially perpendicularly incident on the focal plane B2 into a plurality of split beams, thereby obtaining a single electron beam containing the split beams. Moreover, the correction electron optical system 1118 further adjusts focus positions of the respective split beams.

The first electromagnetic lens system 1124 has the third and fourth multi-axis electromagnetic lenses 1120 and 1122. The third multi-axis electromagnetic lens 1120 has a plurality of lens openings 1119 through which a plurality of electron beams pass, respectively. Also, the fourth multi-axis electromagnetic lens 1122 has a plurality of lens openings 1121 through which a plurality of electron beams pass, respectively.

The first electromagnetic lens system 1124 is a doublet in which the third and fourth multi-axis electromagnetic lenses 1120 and 1122 are arranged side by side in the direction of the optical axis A. In other words, the first electromagnetic lens system 124 includes a plurality of doublets respectively formed by the lens openings 1119 of the third multi-axis electromagnetic lens 1120 and the lens openings 1121 of the fourth multi-axis electromagnetic lens 1122. In a case where the focal length of the third multi-axis electromagnetic lens 1120 (i.e., the focal length of the lens opening 1119) is f1 and the focal length of the fourth multi-axis electromagnetic lens 1122 (i.e., the focal length of the lens opening 1121) is f2, the third and fourth multi-axis electromagnetic lenses 1120 and 1122 are arranged to be away from each other by a distance obtained by adding f1 and f2. The object point of the first electromagnetic lens system 1124 is located at the focus position of the third multi-axis electromagnetic lens 1120 (i.e., on the focal plane B2), while the image point of the first electromagnetic lens system 1124 is located at the focus position of the fourth multi-axis electromagnetic lens 1122 (i.e., on the focal plane B3). The first electromagnetic lens system 1124 reduces the cross section of each of a plurality of electron beams to f2/f1 times.

It is desirable that the third and fourth multi-axis electromagnetic lenses 1120 and 1122 generate magnetic fields that act in opposite directions to each other. Each of the third and fourth multi-axis electromagnetic lenses 1120 and 1122 has a coil wound in such a manner that the coil center is located substantially on the optical axis A, and each of the lens opening 1119 of the third multi-axis electromagnetic lens 1120 and that of the fourth multi-axis electromagnetic lens 1122 generates the magnetic field substantially parallel to the optical axis A. In a case where the lens opening 1119 of the third multi-axis electromagnetic lens 1120 generates the magnetic field in the first direction substantially parallel to the optical axis A, it is desirable that the lens opening 1121 of the fourth multi-axis electromagnetic lens 1122 generate the magnetic field in the second direction substantially opposite to the first direction. By the magnetic fields that act in the opposite directions to each other generated by the third and fourth multi-axis electromagnetic lenses 1120 and 1122, aberration caused in the electron beams by the optical system can be reduced. Especially, chromatic aberration related to magnification, rotation and the like can be reduced.

The rotation/magnification correction lens system 1125 includes the first, second, third, fourth and fifth rotation/magnification correction lenses 1125a, 1125b, 1125c, 1125d and 1125e. The first, second, third, fourth and fifth rotation/magnification correction lenses 1125a, 1125b, 1125c, 1125d and 1125e are desirably electrostatic lenses, and are preferably uni-potential lenses.

It is desirable that the first, second, third, fourth and fifth rotation/magnification correction lenses 1125a, 1125b, 1125c, 1125d and 1125e be provided between the focal planes B2 and B3. It is also desirable that the lens axes of the first, second, third, fourth and fifth rotation/magnification correction lenses 1125a, 1125b, 1125c, 1125d and 1125e be located on substantially the same straight line.

The second rotation/magnification correction lens 1125b corrects the rotation of the electron beam with respect to the optical axis A caused by at least one of the first, second, third, fourth, fifth and sixth multi-axis electromagnetic lenses 1112 1114, 1120, 1122, 1126 and 1128. More specifically, the second rotation/magnification correction lens 1125b corrects the rotation amount of the image of the electron beam on the wafer 1146.

The second rotation/magnification correction lens 1125b corrects the rotation of the corresponding electron beam passing therethrough based on a position on the wafer 1146 (i.e., the focal plane B4) on which that electron beam is incident. The second rotation/magnification correction lens 1125b may correct the rotation of the corresponding electron beam passing therethrough based on a position on the focal plane B2 at which that electron beam passed through the focal plane B2. The second rotation/magnification correction lens 1125b may correct the rotation of the corresponding electron beam passing therethrough based on a position in the third multi-axis electromagnetic lens 1120 at which that electron beam passes through the third multi-axis electromagnetic lens 1120. The second rotation/magnification lens 1125b may correct the rotation of the corresponding electron beam passing therethrough based on the intensity of the magnetic field generated by the corresponding lens opening 1119 of the third multi-axis electromagnetic lens 1120.

It is preferable that the second rotation/magnification correction lens 1125b be arranged within the magnetic field generated by the lens opening 1119 of the third multi-axis electromagnetic lens 1120. Moreover, it is preferable that the second rotation/magnification correction lens 1125b be arranged at substantially equal position to that of the third multi-axis electromagnetic lens 1120 in the direction in which the electron beam travels. In other words, it is preferable that the second rotation/magnification lens 1125b be arranged at the lens center of the corresponding lens opening 1119 of the third multi-axis electromagnetic lens 1120. By arranging the second rotation/magnification correction lens 1125b at the lens center of the corresponding lens opening 1119, it is possible to correct the rotation of the electron beam on the wafer 1146 efficiently.

The first and third rotation/magnification correction lenses 1125a and 1125c correct the magnification (i.e., reduction ratio) of the corresponding electron beam that can be changed by the second rotation/magnification correction lens 1125b. More specifically, the first and third rotation/magnification correction lenses 1125a and 1125c correct the size of the image of the corresponding electron beam formed on the wafer 1146. In addition, the first and third rotation/magnification correction lenses 1125a and 1125c may correct the rotation of the corresponding electron beam caused by at least one of the first, second, third, fourth, fifth and sixth multi-axis electromagnetic lenses 1112, 1114, 1120, 1122 1126 and 1128.

The first rotation/magnification correction lens 1125a corrects the magnification of the corresponding electron beam passing therethrough based on a position on the wafer 1146 (i.e., the focal plane B4) at which that electron beam is incident on the wafer 1146. The first rotation/magnification correction lens 1125a may correct the magnification of the corresponding electron beam passing therethrough based on a position on the focal plane B2 at which that electron beam passed through the focal plane B2. The first rotation/magnification correction lens 1125a may correct the magnification of the corresponding electron beam passing therethrough based on a position in the third multi-axis electromagnetic lens 1120 at which that electron beam passes through the third multi-axis electromagnetic lens 1120. The first rotation/magnification lens 1125a may correct the magnification of the corresponding electron beam passing therethrough based on the intensity of the magnetic field generated by the corresponding lens opening 1119 of the third multi-axis electromagnetic lens 1120.

The third rotation/magnification correction lens 1125c corrects the magnification of the corresponding electron beam passing therethrough based on a position on the wafer 1146 (i.e. the focal plane B4) at which that electron beam is incident on the wafer 1146. The third rotation/magnification correction lens 1125c may correct the magnification of the corresponding electron beam passing therethrough based on a position on the focal plane B2 at which that electron beam passed through the focal plane B2. The third rotation/magnification correction lens 1125c may correct the magnification of the corresponding electron beam passing therethrough based on a position in the third multi-axis electromagnetic lens 1120 at which that electron beam passes through the third multi-axis electromagnetic lens 1120. The third rotation/magnification lens 1125c may correct the magnification of the corresponding electron beam passing therethrough based on the intensity of the magnetic field generated by the lens opening 1119 of the third multi-axis electromagnetic lens 1120.

It is preferable to arrange the first and third rotation/magnification correction lenses 1125a and 1125c within the magnetic field generated by the corresponding lens opening 1119 of the third multi-axis electromagnetic lens 1120. Moreover, it is preferable to arrange the first and third rotation/magnification correction lenses 1125a and 1125c in such a manner that their center are substantially on the lens axis of the second rotation/magnification correction lens 1125b. Furthermore, it is preferable to arrange the first and third rotation/magnification correction lenses 1125a and 1125c so as to be opposed to each other with the second rotation/magnification correction lens 1125b sandwiched therebetween.

In this example, the second rotation/magnification correction lens 1125b corrects the rotation of the electron beam while the first and third rotation/magnification correction lenses 1125a and 1125c correct the magnification of the electron beam. In an alternative example, however, the second rotation/magnification correction lens 1125b may correct the magnification of the electron beam while the first and third rotation/magnification correction lenses 1125a and 1125c may correct the rotation of the electron beam.

The fifth rotation/magnification correction lens 1125e corrects the rotation of the corresponding electron beam with respect to the optical axis A caused by at least one of the first, second, third, fourth, fifth and sixth multi-axis electromagnetic lenses 1112, 1114, 1120, 1122, 1126 and 1128. More specifically, the fifth rotation/magnification correction lens 1125e corrects the rotation amount of the image of the corresponding electron beam on the wafer 1146.

The fifth rotation/magnification correction lens 1125e corrects the rotation of the corresponding electron beam passing therethrough based on a position on the wafer 1146 (i.e., the focal plane B4) at which that electron beam is incident on the wafer 1146. The fifth rotation/magnification correction lens 1125e may correct the rotation of the corresponding electron beam passing therethrough based on a position on the focal plane B2 at which that electron beam passed through the focal plane B2. The fifth rotation/magnification correction lens 1125e may correct the rotation of the corresponding electron beam passing therethrough based on a position in the fourth multi-axis electromagnetic lens 1122 at which that electron beam passes through the fourth multi-axis electromagnetic lens 1122. The fifth rotation/magnification lens 1125e may correct the rotation of the corresponding electron beam passing therethrough based on the intensity of the magnetic field generated by the lens opening 1121 of the fourth multi-axis electromagnetic lens 1122.

It is preferable that the fifth rotation/magnification correction lens 1125e be arranged within the magnetic field generated by the lens opening 1121 of the fourth multi-axis electromagnetic lens 1122. Moreover, it is preferable that the fifth rotation/magnification correction lens 1125e be arranged at substantially equal position to that of the fourth multi-axis electromagnetic lens 1122 in the direction in which the electron beam travels. In other words, it is preferable that the fifth rotation/magnification lens 1125e be arranged at the lens center of the corresponding lens opening 1121 of the fourth multi-axis electromagnetic lens 1122. By arranging the fifth rotation/magnification correction lens 1125e at the lens center of the corresponding lens opening 1121, it is possible to correct the rotation of the electron beam on the wafer 1146 efficiently.

The fourth rotation/magnification correction lens 1125d corrects the magnification of the corresponding electron beam passing therethrough based on a position on the wafer 1146 (i.e., the focal plane B4) at which that electron beam is incident on the wafer 1146. The fourth rotation/magnification correction lens 1125d may correct the magnification of the corresponding electron beam passing therethrough based on a position on the focal plane B2 at which that electron beam passed through the focal plane B2. The fourth rotation/magnification correction lens 1125d may correct the magnification of the corresponding electron beam passing therethrough based on a position in the fourth multi-axis electromagnetic lens 1122 at which that electron beam passes through the fourth multi-axis electromagnetic lens 1122. The fourth rotation/magnification lens 1125d may correct the magnification of the corresponding electron beam passing therethrough based on the intensity of the magnetic field generated by the corresponding lens opening 1121 of the fourth multi-axis electromagnetic lens 1122.

It is preferable that the fourth rotation/magnification correction lens 1125d be arranged in such a manner that the center thereof is located substantially on the focus position C1 of the fourth multi-axis electromagnetic lens 1122 (the focus position of the lens opening 1119), i.e., on a crossover position of the image of the corresponding electron beam passing through that fourth rotation/magnification correction lens 1125d. It is also preferable that the fourth rotation/magnification correction lens 1125d be arranged in such a manner that the center thereof is located substantially on the lens axis of the fifth rotation/magnification correction lens 1125e. By arranging the fourth rotation/magnification correction lens 1125d to have the center located substantially on the crossover position of the image of the corresponding electron beam, it is possible to efficiently correct the magnification of the electron beam on the wafer 146.

By making the arrangement of the first, second and third rotation/magnification correction lenses 1125a, 1125b and 1125c provided in the vicinity of the third multi-axis electromagnetic lens 1120 and the arrangement of the fourth and fifth rotation/magnification correction lenses 1125d and 1125e provided in the vicinity of the fourth multi-axis electromagnetic lens 1122 different from each other, the rotation and magnification of the electron beam can be corrected even in the doublet in which the correction effects may cancel each other.

In this example, the fifth rotation/magnification correction lens 1125e corrects the rotation of the electron beam while the fourth rotation/magnification correction lens 1125d corrects the magnification of the electron beam. In an alternative example, however, the fifth rotation/magnification correction lens 1125e corrects the magnification of the electron beam while the fourth rotation/magnification correction lens 1125d corrects the rotation of the electron beam.

The second electromagnetic lens system 1130 has the fifth and sixth multi-axis electromagnetic lenses 1126 and 1128. The fifth multi-axis electromagnetic lens 1126 has a plurality of lens openings 1123 through which a plurality of electron beams pass, respectively. Also, the sixth multi-axis electromagnetic lens 1128 has a plurality of lens openings 1127 through which a plurality of electron beams pass, respectively.

The second electromagnetic lens system 1130 is a doublet in which the fifth and sixth multi-axis electromagnetic lenses 1126 and 1128 are arranged side by side in the direction of the optical axis A. In other words, the second electromagnetic lens system 1130 includes a plurality of doublets respectively formed by the lens openings 1123 of the fifth multi-axis electromagnetic lens 1126 and the lens openings 1127 of the sixth multi-axis electromagnetic lens 1128. In a case where the focal length of the fifth multi-axis electromagnetic lens 1126 (i.e., the focal length of the lens opening 1123) is f3 and the focal length of the sixth multi-axis electromagnetic lens 1128 (i.e., the focal length of the lens opening 1127) is f4, the fifth and sixth multi-axis electromagnetic lenses 1126 and 1128 are arranged to be away from each other by a distance obtained by adding f3 and f4. The object point of the second electromagnetic lens system 1130 is located at the focus position of the fifth multi-axis electromagnetic lens 1126 (i.e., on the focal plane B3), while the image point of the second electromagnetic lens system 1130 is located at the focus position of the sixth multi-axis electromagnetic lens 1128 (i.e., on the focal plane B4). The second electromagnetic lens system 1130 reduces the cross section of each of a plurality of electron beams to $f4/f3$ times.

It is desirable that the fifth and sixth multi-axis electromagnetic lenses 1126 and 1128 generate magnetic fields that act in opposite directions to each other. Each of the fifth and sixth multi-axis electromagnetic lenses 1126 and 1128 has a coil wound in such a manner that the coil center is located substantially on the optical axis A, and the lens opening 1123 of the fifth multi-axis electromagnetic lens 1126 and the lens opening 1127 of the sixth multi-axis electromagnetic lens 1128 generate the magnetic fields substantially parallel to the optical axis A. In a case where the lens opening 1119 of the third multi-axis electromagnetic lens 1120 generates the magnetic field in the first direction, it is desirable that the lens opening 1123 of the fifth multi-axis electromagnetic lens 1126 generate the magnetic field in the second direction. Moreover, in this case, it is desirable that the lens opening 1127 of the sixth multi-axis electromagnetic lens 1128 generate the magnetic field in the first direction. By generating the magnetic fields that act in the opposite directions to each other by mean of the fifth and sixth multi-axis electromagnetic lenses 1126 and 1128, aberration caused in the electron beam by the optical system can be reduced. Especially, chromatic aberration related to the magnification, rotation and the like can be reduced.

Each deflection system 1142 includes a sub-deflector 1136, the first main deflector 1138 and the second main deflector 1140. The first and second main deflectors 1138 and 1140 are used for deflecting the electron beam from one of sub-fields to another, each sub-field containing a plurality of areas each of which can be irradiated with one shot of the electron beam (shot areas). Moreover, the sub-deflector 1136 has a smaller deflection amount than those of the first and second main deflectors 1138 and 1140, and is used for deflecting the electron beam from one of the shot areas to another within each sub-field. The sub-deflector 1136 and the first and second main deflectors 1138 and 1140 are desirably multi-electrode type cylindrical electrode having eight or more electrodes, and preferably have an effect of a uni-potential lens depending on the polarity of an applied signal.

It is desirable that the deflection system 1142 be provided between the focal plane B3 and the focal plane B4 (i.e., the surface of the wafer 1146). Moreover, it is preferable that the first main deflector 1138 be arranged in such a manner that the center thereof is located substantially on the focus position C2 of the sixth multi-axis electromagnetic lens 1128 (i.e., the focus position of the lens opening 1127) that corresponds to the crossover position of the image of the electron beam passing through the first main deflector 1138. The first main deflector 1138 may correct astigmatism of the electron beam while the second main deflector 1140 may correct the focus of the electron beam.

Please note that the focal plane B2 is located between the electron guns 1110 and the wafer 1146 and the focal plane B3 is located between the focal plane B2 and the wafer 1146. Furthermore, please note that the focal planes B1, B2, B3 and B4 are substantially perpendicular to the optical axis A.

The controlling system 1200 includes a general controller 1202 and an individual controller 1204. The general controller 1202 is a workstation, for example, and generally controls respective controllers included in the individual controller 1204. The individual controller 1204 includes a controller for illumination electron optical system 1206, a controller for correction electron optical system 1208, a controller for rotation/magnification correction lens system 1210, a controller for electron lens system 1212, a deflection system controller 1216, a backscattered electron processing unit 1218 and an wafer-stage controller 1220.

The controller for illumination electron optical system 1206 controls powers respectively supplied to the first and second multi-axis electromagnetic lenses 1112 and 1114 of the illumination electron optical system 1116. More specifically, the controller for illumination electron optical system 1206 adjusts the powers respectively supplied to the first and second multi-axis electromagnetic lenses 1112 and 1114 individually, thereby enlarging the cross section of each of a plurality of electron beams imaged on the focal plane B2, and further makes the electron beams having the enlarged cross sections respectively enter the correction electron optical system 1118 substantially perpendicularly.

The controller for correction electron optical system 1208 controls a plurality of correction electron optical systems 1118 each including the aperture array, the blanker array, the electromagnetic lens array, and the stopper array. More specifically, the controller for correction electron optical system 1208 controls voltages respectively applied to a plurality of blanking electrodes of the blanker array. In addition, the controller for correction electron optical system 1208 controls powers respectively supplied to a plurality of electromagnetic lenses of the electromagnetic lens array.

The controller for rotation/magnification correction lens 1210 controls voltages respectively applied to a plurality of first rotation/magnification lenses 1125a, a plurality of second rotation/magnification lenses 1125b, a plurality of third rotation/magnification lenses 1125c, a plurality of fourth rotation/magnification lenses 1125d and a plurality of fifth rotation/magnification lenses 1125e. The controller 1210 adjusts a plurality of rotation/magnification correction lens systems 125, thereby allowing a plurality of electron beams to be incident on the wafer 1146 in such a manner that each electron beam has the cross-sectional shape of desired orientation and size.

The controller for electromagnetic lens system 1212 controls powers respectively supplied to the first, second, third, fourth, fifth and sixth multi-axis electromagnetic lenses 1112, 1114, 1120, 1122, 1126, and 1128. More specifically, the controller 1212 adjusts the current amounts supplied to the coils of the third and fourth multi-axis electromagnetic lenses 1120 and 1122 so that the third and fourth multi-axis electromagnetic lenses 1120 and 1122 form together a doublet. Similarly, the controller 1212 adjusts the current amount supplied to the coils of the fifth and sixth multi-axis electromagnetic lenses 1126 and 1128 so that the fifth and sixth multi-axis electromagnetic lenses 1126 and 1128 form together a doublet.

The deflection system controller 1216 controls the deflection amounts of electron beams by a plurality of sub-deflectors 1136, a plurality of first main deflectors 1138, and a plurality of second main deflectors 1140. The controller 1216 may control the first main deflectors 1138 to cause the first main deflectors 1138 to make astigmatism correction. More specifically, the controller 1216 may control voltages applied to the first main deflectors 1138 to cause the first main deflectors 1138 to make astigmatism correction. In addition, the controller 1216 may control voltages applied to the second main deflectors 1140 so as to cause the second main deflectors 1140 to make focus correction.

The backscattered electron processing unit 1218 detects digital data indicative of the amount of electrons based on an electric signal detected by the backscattered electron detector 1144, and sends the digital data to the general controller 1202. The wafer-stage controller 1220 moves the wafer stage 1148 to a desired position.

Figure 4:
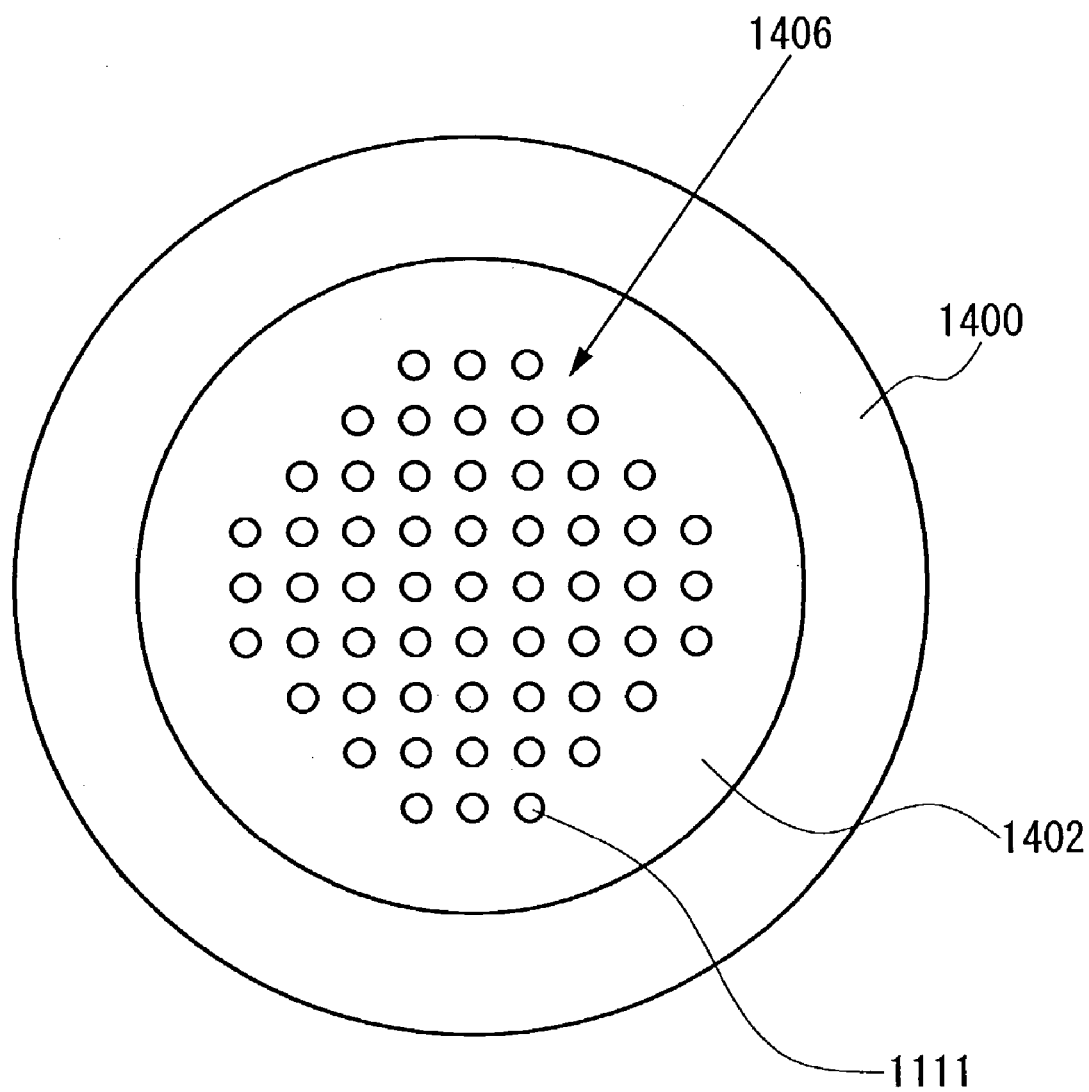
FIG. 4 shows a top view of the first electromagnetic lens provided in the electron beam exposure apparatus according to the second embodiment of the present invention.

FIG. 4 shows a top view of the first multi-axis electromagnetic lens 1112 according to the present embodiment. Please note that the second, third, fourth, fifth and sixth multi-axis electromagnetic lenses 1114, 1120, 1122, 1126 and 1128 have similar structures to that of the first multi-axis electromagnetic lens 1116.

The first multi-axis electromagnetic lens 1112 has a coil part 1400 and a lens part 1402. The lens part 1402 includes lens openings 1111 through which electron beams pass, respectively and a lens region 1406 that is a predetermined region containing the lens openings 1111. The coil part 1400 is provided to surround the lens part 1402 and generates a magnetic field. Moreover, the lens openings 1111 generate magnetic fields, respectively, and form a lens. It is preferable that a plurality of lens openings 1111 through which a plurality of electron beams pass be arranged to correspond to positions of a plurality of sub-deflectors 1136, a plurality of first main deflectors 1138 and/or a plurality of second main deflectors 1140, respectively. The lens part 1402 may includes in an outer peripheral region of the lens region 1406 a plurality of dummy openings through which no electron beam passes in order to make the magnetic fields formed by the lens openings 1111 uniform.

Figure 5:
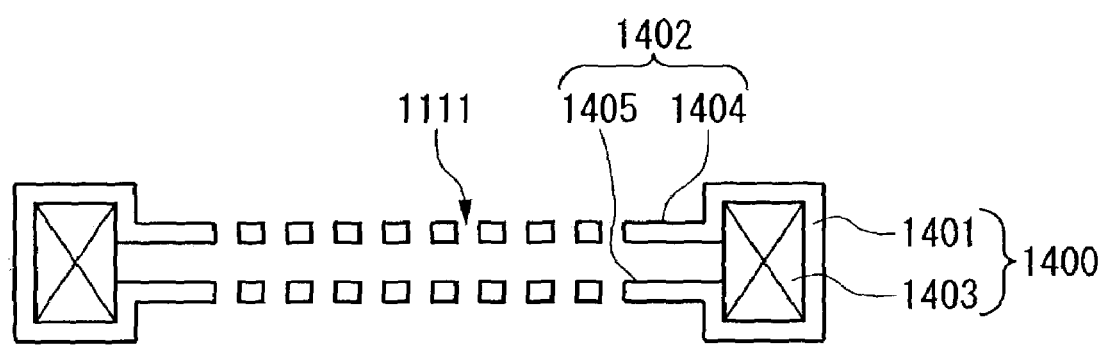
FIG. 5 shows a cross-sectional view of the first electromagnetic lens shown in FIG. 4.

FIG. 5 shows a cross-sectional view of the first multi-axis electromagnetic lens 1112 according to the present embodiment. Please note that the second, third, fourth, fifth and sixth multi-axis electromagnetic lenses 1114, 1120, 1122, 1126 and 1128 have similar structures to that of the first multi-axis electromagnetic lens 1116.

The coil part 1400 includes a coil-part magnetic conductive member 1401 that is a magnetic conductive member and a coil 1403 that generates the magnetic field. The lens part 1402 includes the first lens-part magnetic conductive member 1404 and the second lens-part magnetic conductive member 1405. A plurality of lens openings 1111 in the first and second lens-part magnetic conductive members 1404 and 1405 form lenses allowing electron beams to pass therethrough, respectively. In the lens opening 1111, the magnetic field is generated by the first and second lens-part magnetic conductive members 1404 and 1405. The electron beams entering a plurality of lens openings 1111 are affected by the magnetic fields generated by the first and second lens-part magnetic conductive members 1404 and 1405, and are therefore converged independently of each other.

Figure 6:
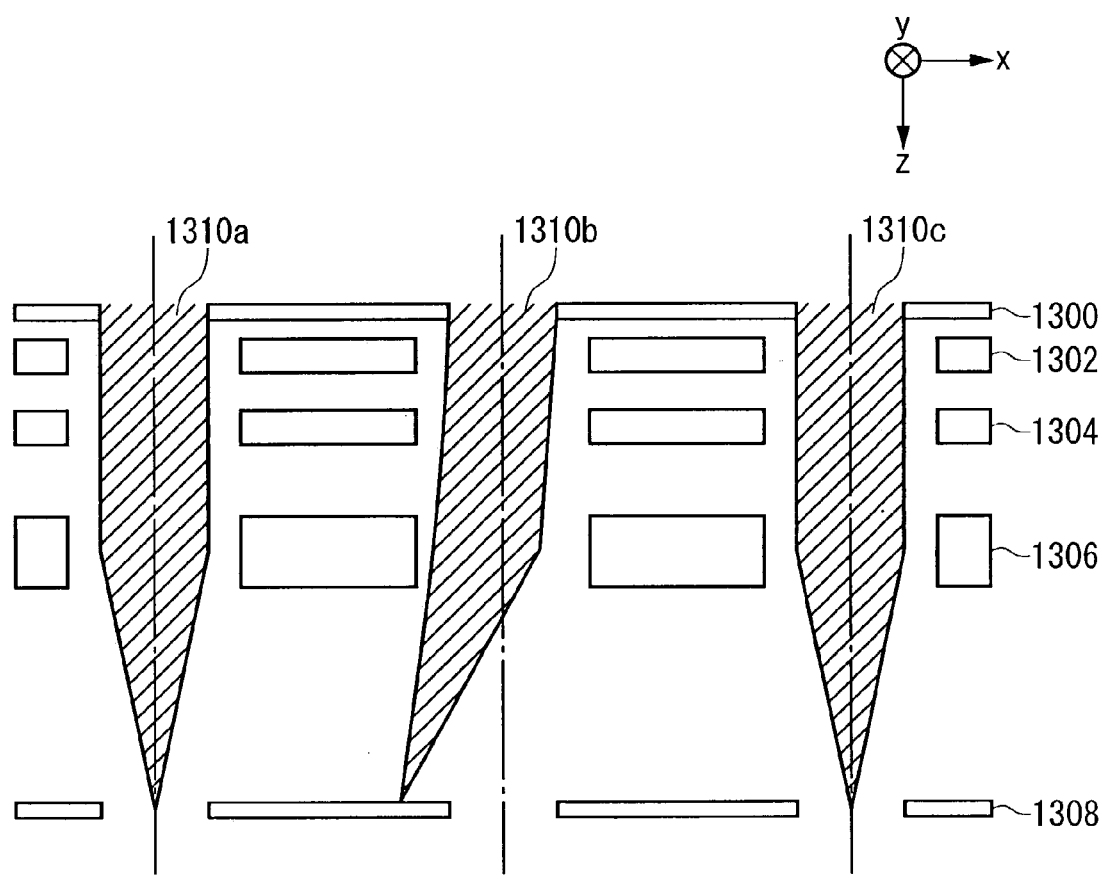
FIG. 6 shows an exemplary structure of a correction electron optical system provided in the electron beam exposure apparatus according to the second embodiment of the present invention.

FIG. 6 shows an exemplary structure of the correction electron optical system 1118 according to the present embodiment. The correction electron optical system 1118 includes an aperture array 1300, an X-direction blanker array 1302, a Y-direction blanker array 1304, an electromagnetic lens array 1306 and a stopper array 1308.

The aperture array 1300 has a plurality of apertures formed in a substrate each of which defines a cross-sectional shape of an electron beam. The aperture array 1300 splits each electron beam incident on the correction electron optical system 118 substantially perpendicularly into a plurality of split beams 1310a, 1310b, 1310c, . . . . The X-direction blanker array 1302 has a plurality of individual deflectors that respectively deflect the corresponding split beams obtained by the aperture array 1300 in the X-direction. The Y-direction blanker array 1304 has a plurality of minute deflectors that respectively deflect the corresponding split beams obtained by the aperture array 1300 in the Y-direction.

The electromagnetic lens array 1306 has a plurality of electrostatic lenses that respectively converge the corresponding split beams that passed through the X-direction blanker array 1302 and the Y-direction blanker array 1304. The electromagnetic lens array 1306 corrects distortion aberration caused by the first electromagnetic lens system 1124 and/or the second electromagnetic lens system 1130 by converging the split beams independently of each other and adjusting the focus positions of the respective split beams. The stopper array 1308 has a plurality of apertures formed in a substrate and blocks the split beams deflected by the X-direction blanker array 1302 and/or the Y-direction blanker array 1304. The split beam deflected by the X-direction blanker array 1302 in the X-direction, like the beam 1310b in FIG. 6, does not pass through the stopper array 1308 and therefore is blocked so as not to reach the wafer 1146. On the other hand, the split beam that was not deflected by the X-direction blanker array 1302 and the Y-direction blanker array 1304, like the beams 1310a and 1310c, passes through the stopper array 1308 so as to reach the wafer 1146.

Next, an operation of the electron beam exposure apparatus 1010 according to the present embodiment is described referring to FIGS. 3, 4, 5 and 6. On the wafer stage 1148, wafer 1146 to be exposed is placed. The wafer-stage controller 1220 moves the wafer stage 1148 so as to place an area on the wafer 1146 that is to be exposed, in the vicinity of the optical axis A. Moreover, the X-direction blanker array 1302 and/or the Y-direction blanker array 1304 deflects the electron beam so as to prevent the electron beam from being incident on the wafer 1146 before exposure starts, since the electron gun 1110 always emits the electron beam during the exposure process.

The controller for illumination electron optical system 1206 adjusts the first and second multi-axis electromagnetic lenses 1112 and 1114 so as to allow a plurality of electron beams to be incident on desired regions of the correction electron optical systems 1118 substantially perpendicularly, respectively. The controller for correction electron optical system 1208 adjusts a plurality of electrostatic lenses of the electromagnetic lens array 1306 included in each of the correction electron optical systems 1118 in order to obtain desired imaging conditions for respective split beams. The controller for rotation/magnification correction lens system 1210 adjusts each of a plurality of first rotation/magnification correction lenses 1125a, a plurality of second rotation/magnification correction lenses 1125b, a plurality of third rotation/magnification correction lenses 1125c, a plurality of fourth rotation/magnification correction lenses 1125d and a plurality of fifth rotation/magnification correction lenses 1125e to allow each of the electron beams each containing a plurality of split beams to have a cross section of desired orientation and size on the wafer 1146. The controller for electromagnetic lens system 1212 adjusts the third, fourth, fifth and sixth multi-axis electromagnetic lenses 1120, 1122, 1126 and 1128 so as to allow each of the electron beams to have the cross section of desired orientation and size on the wafer 146. The deflection system controller 1216 adjusts a plurality of sub-deflectors 1136, a plurality of first main deflectors 1138, and a plurality of second main deflectors 1140 to allow a plurality of electron beams to be incident on desired areas on the wafer 1146.

After the illumination electron optical system 1116, the correction electron optical systems 1118, the first electro magnetic lens system 1124, a plurality of rotation/magnification correction lens systems 1125, the second electromagnetic lens system 1130, and a plurality of deflection systems 1142 were adjusted, the deflection of the electron beams by the X-direction blanker array 1302 and/or the Y-direction blanker array 1304 of the correction electron optical systems 118 is stopped. Thus, the electron beams start to be incident on the wafer 1146 as described below.

First, the illumination electron optical system 1116 enlarges the cross section of each of the electron beams respectively generated by the electron guns 1110 and adjusts the focus positions of the electron beams to be respectively positioned in the corresponding correction electron optical systems 1118, thereby making the electron beams respectively be incident on predetermined regions of the correction electron optical system 1118 substantially perpendicularly. In each of the correction electron optical systems 1118, the aperture array 1300 splits the corresponding electron beam into a plurality of split beams and also shapes the cross-sectional shape of the split beam to be rectangular. Then, the X-direction blanker array 1302 and/or the Y-direction blanker array 1304 switches its state between a state where the corresponding electron beam is allowed to be incident on the wafer 1146 and a state where the corresponding electron beam is prevented from being incident on the wafer 1146, by applying the voltage to the respective blanking electrodes. The split beam that was not deflected by the X-direction blanker array 1302 and/or the Y-direction blanker array 1304 is subjected to focus adjustment in the electromagnetic lens array 1306 and then passes through the corresponding aperture of the stopper array 1308. The split beam deflected by the X-direction blanker array 1302 and/or the Y-direction array 1304 is also subjected to the focus adjustment in the electromagnetic lens array 1306. However, it cannot pass through the corresponding aperture of the stopper array 1308, thereby being blocked by the stopper array 1308.

Subsequently, the first electromagnetic lens system 1124 reduces the cross section of each of the electron beams each containing a plurality of split beams, that respectively passed through the correction electron optical system 1118. Then, each of a plurality of rotation/magnification correction lens systems 1125 corrects the rotation of the corresponding electron beam with respect to the optical axis A and/or the magnification (i.e., the reduction ratio) of that electron beam, that occurs when the first and second electromagnetic lens systems 1124 and 1130 rotate that electron beam and reduce the cross section of that electron beam.

Then, the second electromagnetic lens system 1130 further reduces the cross section of each of the electron beams that were reduced by the first electromagnetic lens system 1124, and adjusts the focus of each electron beam so that the focus be located on the wafer 1146. The deflection system 1142 deflects the corresponding electron beam by the sub-deflector 1136, the first main deflector 1138 and the second main deflector 140 to direct it onto a predetermined shot area on the wafer 1146. Thus, a plurality of electron beams are made to be incident on the wafer 1146, thereby transferring a pattern image of the apertures of the aperture arrays 1300 onto the predetermined shot area on the wafer 1146. By the aforementioned process, a pattern having the shape of the apertures of the aperture array 1300 is transferred on the predetermined shot area on the wafer 1146 by exposure.

According to the electron beam exposure apparatus 1010 according to the present embodiment, a plurality of rotation/magnification correction lenses (the first, second, third, fourth, and fifth rotation/magnification correction lenses 1125a, 1125b, 1125c, 1125d and 1125e) are used for correcting static error amounts such as the rotation and magnification of the electron beam caused by the first and second electromagnetic lens systems 1124 and 1130, and the like. Therefore, it is possible to precisely correct the rotation and magnification of the electron beam, aberration in the electron beam, and the like. Moreover, since the rotation/magnification correction lens system 1125 is provided for each of a plurality of electron beams, it is possible to precisely correct the rotation and magnification of each of the electron beams, aberration in each of the electron beams, and the like.

Please note that the electron beam exposure apparatus according to the present invention may be an electron beam exposure apparatus using a variable rectangle or an electron beam exposure apparatus using a blanking aperture array device. The electron beam exposure apparatus 1010 mentioned above is an exemplary electron beam processing apparatus of the present invention. The electron beam processing apparatus according to the present invention may be an electron microscope, an electron beam tester or the like, other than the electron beam exposure apparatus.

As is apparent from the above description, according to the present invention, an electron beam exposure apparatus that transfers a pattern onto wafer by exposure using a plurality of electron beams can be provided.

Although the present invention has been described by way of exemplary embodiments, it should be understood that those skilled in the art might make many changes and substitutions without departing from the spirit and the scope of the present invention which is defined only by the appended claims.

What is claimed is:

1. An electron beam exposure apparatus for exposing wafer with an electron beam, comprising:
    a first electromagnetic doublet lens system operable to make said electron beam that was incident substantially perpendicularly on a first plane be incident on a second plane substantially perpendicularly, said first electromagnetic doublet lens system including a plurality of electromagnetic lenses;
    a second electromagnetic doublet lens system operable to make said electron beam that was substantially perpendicularly incident on said second plane be incident on said wafer substantially perpendicularly, said second electromagnetic doublet lens system including a plurality of electromagnetic lenses;
    a rotation correction lens operable to correct rotation of said electron beam caused by at least said first electromagnetic lens system, said rotation correction lens being provided within said first electromagnetic doublet lens system;
    a deflection system operable to deflect said electron beam to a position on said wafer, that is to be irradiated with said electron beam; and
    a deflection-correction optical system operable to correct deflection aberration caused by said deflection system, said deflection-correction optical system being provided within said second electromagnetic doublet lens system;
    wherein said first electromagnetic doublet lens system further includes a first electromagnetic lens having a first focal length and a second electromagnetic lens having a second focal length, said second electromagnetic lens being arranged away from said first electromagnetic lens substantially equal to a distance obtained by adding said first focal length and said second focal length, and wherein said first electromagnetic lens generates a magnetic field in a first direction and said second electromagnetic lens generates a magnetic field in a second direction opposite to said first direction; and
    wherein said second electromagnetic doublet lens system further includes a third electromagnetic lens having a third focal length and a fourth electromagnetic lens having a fourth focal length, said fourth electromagnetic lens being arranged away from said third electromagnetic lens substantially equal to a distance obtained by adding said third focal length and said fourth focal length, and wherein said third electromagnetic lens generates a magnetic field in said second direction, and said fourth electromagnetic lens generates a magnetic field in said first direction.

2. An electron beam exposure apparatus as claimed in claim 1, wherein said first electromagnetic doublet lens system reduces said electron beam incident on said first plane and makes said reduced electron beam be incident on said second plane, and said second electromagnetic doublet lens system reduces said electron beam incident on said second plane and makes said reduced electron beam be incident on said wafer.

3. An electron beam exposure apparatus as claimed in claim 1, wherein said rotation correction lens is provided between said first plane and said second plane.

4. An electron beam exposure apparatus as claimed in claim 1, wherein said deflection-correction optical system is provided between said second plane and said wafer.

5. An electron beam exposure apparatus as claimed in claim 1, wherein said rotation correction lens is arranged within a magnetic field generated by said first electromagnetic lens or said second electromagnetic lens in said first electromagnetic doublet lens system.

6. An electron beam exposure apparatus as claimed in claim 1, wherein a lens center of said rotation correction lens is arranged at a position approximately equal to a lens center of said second electromagnetic lens in a direction in which said electron beam travels.

7. An electron beam exposure apparatus as claimed in claim 1, wherein a lens axis of said rotation correction lens is located at a position approximately equal to a lens axis of said second electromagnetic lens in a direction substantially perpendicular to a direction in which said electron beam travels.

8. An electron beam exposure apparatus as claimed in claim 1, wherein said rotation correction lens is an electrostatic lens.

9. An electron beam exposure apparatus as claimed in claim 1, wherein said rotation correction lens further corrects magnification of said electron beam caused by at least said first electromagnetic doublet lens system.

10. An electron beam exposure apparatus as claimed in claim 1, wherein
said deflection system includes a main deflector and a sub-deflector, and
said deflection-correction optical system corrects said deflection aberration of said electron beam caused by at least one of said main deflector and said sub-deflector.

11. An electron beam exposure apparatus as claimed in claim 1, wherein said deflection-correction optical system includes:
an astigmatism corrector operable to correct astigmatism of said electron beam; and
a focus corrector operable to correct a focus of said electron beam.

12. An electron beam exposure apparatus as claimed in claim 1, further comprising:
an electron gun operable to emit said electron beam; and
an illumination electron optical system operable to make said electron beam emitted by said electron gun be incident on said first plane substantially perpendicularly.

13. An electron beam exposure apparatus as claimed in claim 12, further comprising a correction electron optical system operable to split said electron beam that was substantially perpendicular incident on said first plane into a plurality of electron beams.

14. An electron beam exposure apparatus for exposing wafer with an electron beam, comprising:
a first electromagnetic doublet lens system operable to make said electron beam that was substantially perpendicularly incident on a first plane be incident on a second plane substantially perpendicularly, said first electromagnetic doublet lens system including a plurality of electromagnetic lenses;
a second electromagnetic doublet lens system operable to make said electron beam that was substantially perpendicularly incident on said second plane be incident on said wafer substantially perpendicularly, said second electromagnetic doublet lens system including a plurality of electromagnetic lenses;
a magnification correction lens operable to correct magnification of said electron beam caused by at least said first electromagnetic lens system, said magnification correction lens being provided within said first electromagnetic doublet lens system;
a deflection system operable to deflect said electron beam to a position on said wafer, that is to be irradiated with said electron beam; and
a deflection-correction optical system operable to correct deflection aberration caused by said deflection system, said deflection-correction optical system being provided within said second electromagnetic doublet lens system;
wherein said first electromagnetic doublet lens system further includes a first electromagnetic lens having a first focal length and a second electromagnetic lens having a second focal length, said second electromagnetic lens being arranged away from said first electromagnetic lens substantially equal to a distance obtained by adding said first focal length and said second focal length, and wherein said first electromagnetic lens generates a magnetic field in a first direction and said second electromagnetic lens generates a magnetic field in a second direction opposite to said first direction; and
wherein said second electromagnetic doublet lens system further includes a third electromagnetic lens having a third focal length and a fourth electromagnetic lens having a fourth focal length, said fourth electromagnetic lens being arranged away from said third electromagnetic lens substantially equal to a distance obtained by adding said third focal length and said fourth focal length, and wherein said third electromagnetic lens generates a magnetic field in said second direction, and said fourth electromagnetic lens generates a magnetic field in said first direction.

15. An electron beam processing unit comprising:
a first electromagnetic doublet lens system operable to make an electron beam that was substantially perpendicularly incident on a first plane be incident on a second plane substantially perpendicularly, said first electromagnetic doublet lens system including a plurality of electromagnetic lenses;
a second electromagnetic doublet lens system operable to make said electron beam that was substantially perpendicularly incident on said second plane be incident on a third plane substantially perpendicularly, said second electromagnetic doublet lens system including a plurality of electromagnetic lenses;
a rotation correction lens operable to correct rotation of said electron beam caused by at least said first electromagnetic lens system, said rotation correction lens being provided within said first electromagnetic doublet lens system;
a deflection system operable to deflect said electron beam to a position on said third plane, that is to be irradiated with said electron beam; and
a deflection-correction optical system operable to correct deflection aberration caused by said deflection system, said deflection-correction optical system being provided within said second electromagnetic doublet lens system;
wherein said first electromagnetic doublet lens system further includes a first electromagnetic lens having a first focal length and a second electromagnetic lens having a second focal length, said second electromagnetic lens being arranged away from said first electromagnetic lens substantially equal to a distance obtained by adding said first focal length and said second focal length, and wherein said first electromagnetic lens generates a magnetic field in a first direction and said second electromagnetic lens generates a magnetic field in a second direction opposite to said first direction; and
wherein said second electromagnetic doublet lens system further includes a third electromagnetic lens having a third focal length and a fourth electromagnetic lens having a fourth focal length, said fourth electromagnetic lens being arranged away from said third electromagnetic lens substantially equal to a distance obtained by adding said third focal length and said fourth focal length, and wherein said third electromagnetic lens generates a magnetic field in said second direction, and said fourth electromagnetic lens generates a magnetic field in said first direction.

16. An electron beam processing unit comprising:
a first electromagnetic lens doublet system operable to make an electron beam that was substantially perpendicularly incident on a first plane be incident on a second plane substantially perpendicularly, said first electromagnetic doublet lens system including a plurality of electromagnetic lenses;

a second electromagnetic doublet lens system operable to make said electron beam that was substantially perpendicularly incident on said second plane be incident on a third plane substantially perpendicularly, said second electromagnetic doublet lens system including a plurality of electromagnetic lenses;

a magnification correction lens operable to correct magnification of said electron beam caused by at least said first electromagnetic lens system, said magnification correction lens being provided within said first electromagnetic doublet lens system;

a deflection system operable to deflect said electron beam to a position on said third plane, that is to be irradiated with said electron beam; and a deflection-correction optical system operable to correct deflection aberration caused by said deflection system, said deflection-correction optical system being provided within said second electromagnetic doublet lens system;

wherein said first electromagnetic doublet lens system further includes a first electromagnetic lens having a first focal length and a second electromagnetic lens having a second focal length, said second electromagnetic lens being arranged away from said first electromagnetic lens substantially equal to a distance obtained by adding said first focal length and said second focal length, and wherein said first electromagnetic lens generates a magnetic field in a first direction and said second electromagnetic lens generates a magnetic field in a second direction opposite to said first direction; and wherein said second electromagnetic doublet lens system further includes a third electromagnetic lens having a third focal length and a fourth electromagnetic lens having a fourth focal length, said fourth electromagnetic lens being arranged away from said third electromagnetic lens substantially equal to a distance obtained by adding said third focal length and said fourth focal length, and wherein said third electromagnetic lens generates a magnetic field in said second direction, and said fourth electromagnetic lens generates a magnetic field in said first direction.

* * * * *